(12) United States Patent
Li et al.

(10) Patent No.: US 7,364,665 B2
(45) Date of Patent: Apr. 29, 2008

(54) SELECTIVE ETCHING PROCESSES OF $SiO_2$, TI AND $IN_2O_3$ THIN FILMS FOR FERAM DEVICE APPLICATIONS

(75) Inventors: Tingkai Li, Vancouver, WA (US); Bruce D. Ulrich, Beaverton, OR (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 721 days.

(21) Appl. No.: 10/970,885

(22) Filed: Oct. 21, 2004

(65) Prior Publication Data
US 2006/0091107 A1 May 4, 2006

(51) Int. Cl.
- B44C 1/22 (2006.01)
- C03C 15/00 (2006.01)
- C03C 25/68 (2006.01)
- C23F 1/00 (2006.01)

(52) U.S. Cl. .......................................... 216/72; 216/67
(58) Field of Classification Search ................. 216/67, 216/72, 75; 438/720
See application file for complete search history.

(56) References Cited

U.S. PATENT DOCUMENTS

| | | | | |
|---|---|---|---|---|
| 6,265,318 B1* | 7/2001 | Hwang et al. | ............... | 438/720 |
| 6,635,498 B2* | 10/2003 | Summerfelt et al. | ........... | 438/3 |
| 2005/0045590 A1* | 3/2005 | Hall et al. | .................... | 216/67 |
| 2005/0070114 A1* | 3/2005 | Li et al. | ..................... | 438/706 |

OTHER PUBLICATIONS

U.S. Appl. No. 10/659,547, filed Sep. 3, 2003, Hsu et al.

* cited by examiner

Primary Examiner—Roberts Culbert
(74) Attorney, Agent, or Firm—David C. Ripma

(57) ABSTRACT

A method of selectively etching a three-layer structure consisting of $SiO_2$, $In_2O_3$, and titanium, includes etching the $SiO_2$, stopping at the titanium layer, using $C_3F_8$ in a range of between about 10 sccm to 30 sccm; argon in a range of between about 20 sccm to 40 sccm, using an RF source in a range of between about 1000 watts to 3000 watts and an RF bias in a range of between about 400 watts to 800 watts at a pressure in a range of between about 2 mtorr to 6 mtorr; and etching the titanium, stopping at the $In_2O_3$ layer, using BCl in a range of between about 10 sccm to 50 sccm; chlorine in a range of between about 40 sccm to 80 sccm, a $T_{cp}$ in a range of between about 200 watts to 500 watts at an RF bias in a range of between about 100 watts to 200 watts at a pressure in a range of between about 4 mtorr to 8 mtorr.

5 Claims, 3 Drawing Sheets

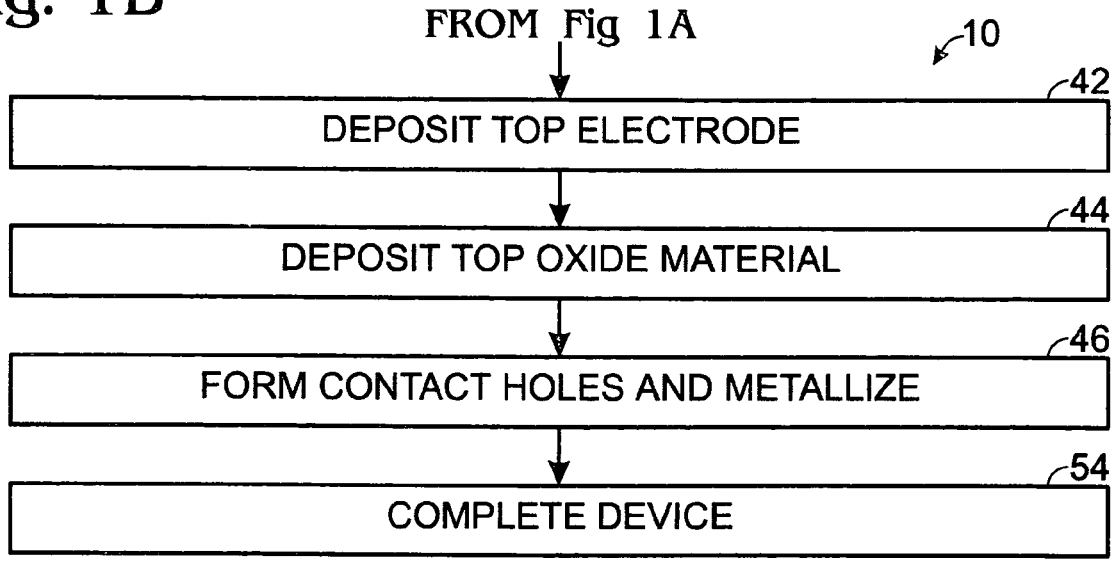
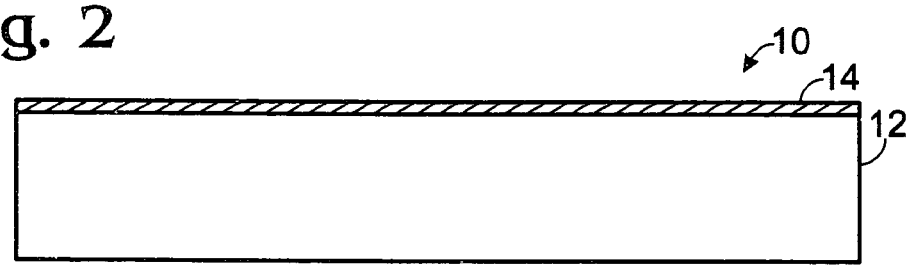
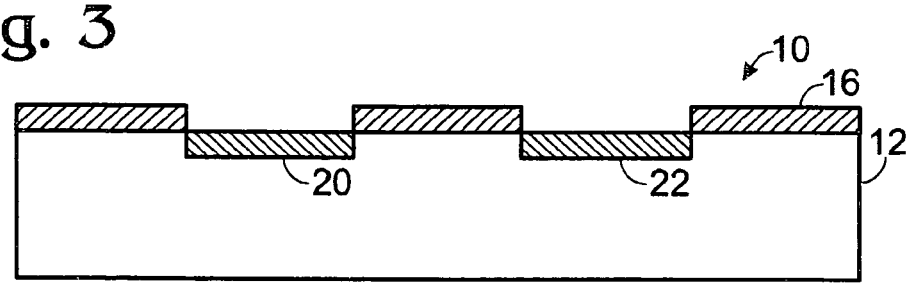
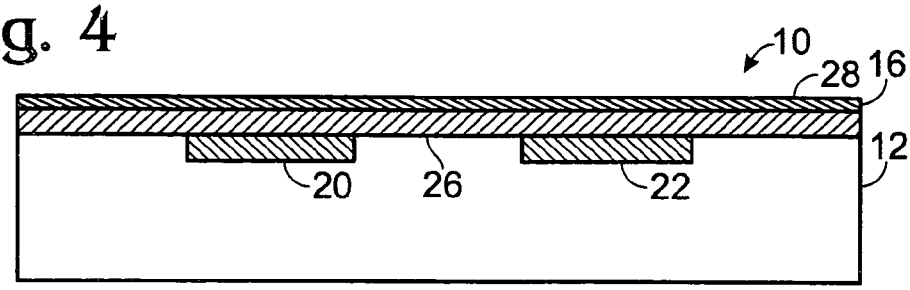

SELECTIVE ETCHING PROCESSES OF SIO$_2$, TI AND IN$_2$O$_3$ THIN FILMS FOR FERAM DEVICE APPLICATIONS

FIELD OF THE INVENTION

The present invention relates to ferroelectric memory device structures and specifically to an integrated process for fabricating ferroelectric non-volatile memory devices.

BACKGROUND OF THE INVENTION

A number of Metal/FE/In$_2$O$_3$/Si memory cells for one-transistor ferroelectric memory devices have been proposed, however, such a device requires formation of an oxide trench structure in the ferroelectric material, and selective deposition of In$_2$O$_3$ in the trench. This in turn requires an etching processes for SiO$_2$ which is stopped at a In$_2$O$_3$ layer. Such a process is not known at this time. Conductive Metal Oxide Gate Ferroelectric Memory Transistor, Ser. No. 10/659,547, filed Sep. 9, 2003 of Hsu et al., provides some background to this problem.

SUMMARY OF THE INVENTION

A method of selectively etching a three-layer structure consisting of SiO$_2$, In$_2$O$_3$, and titanium, includes etching the SiO$_2$, stopping at the titanium layer, using C$_3$F$_8$ in a range of between about 10 sccm to 30 sccm; argon in a range of between about 20 sccm to 40 sccm, using an RF source in a range of between about 1000 watts to 3000 watts and an RF bias in a range of between about 400 watts to 800 watts at a pressure in a range of between about 2 mtorr to 6 mtorr; and etching the titanium, stopping at the In$_2$O$_3$ layer, using BCl in a range of between about 10 sccm to 50 sccm; chlorine in a range of between about 40 sccm to 80 sccm, a T$_{cp}$ in a rang watts to 200 watts at a pressure in a range of between about 4 mtorr to 8 mtorr.

It is an object of the invention to provide selective etching technologies of SiO$_2$, titanium and In$_2$O$_3$ thin films for MFM$_{ox}$ such as Metal/FE/In$_2$O$_3$/Si FeRAM devices.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIGS. 2-7 depicts steps in the method of the invention.

DETAILED DESCRIPTION OF THE PREFERRED EMBODIMENTS

The method of the invention includes a selective etching processes of SiO$_2$ which is stopped by a titanium layer, which titanium layer is then etched, wherein the etching of the titanium layer is stopped by a In$_2$O$_3$ thin film. This etching process is particularly suitable for MFM$_{ox}$ (Metal-Ferroelectric-Metal oxide) FeRAM fabrication, although it may be used in other types of device fabrication.

Figure 1A:
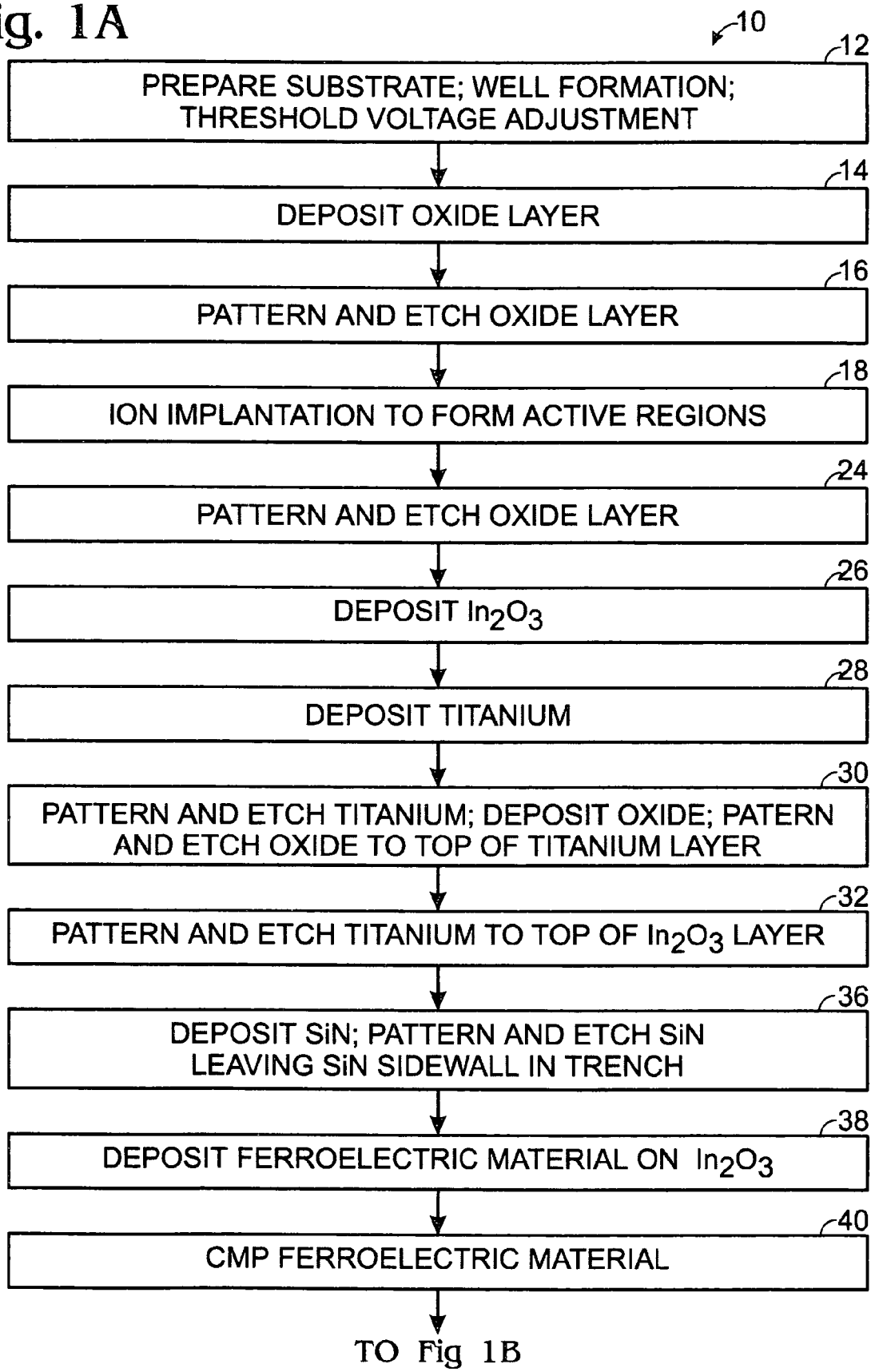
FIG. 1 is a block diagram of the method of the invention.

The integration process of the method of the invention 10 is depicted in FIG. 1 and FIGS. 2-8. Referring to FIGS. 1 and 2, a substrate 12 is prepared and an oxide layer 14 is deposited thereon to a thickness of between about 10 nm to 50 nm. Substrate preparation may also include well formation and ion implantation for threshold voltage adjustment.

FIG. 3 depicts the structure following deposition of additional oxide 16 to a thickness of between about 100 nm to 300 nm, after removal of oxide layer 14, followed by patterning and etching of the oxide layer 16, and ion implantation 18 to form source 20 and drain 22.

FIG. 4 depicts the structure following a wet etch of oxide layer 16, deposit of another thin oxide layer 17 to a thickness of between about 10 nm to 50 nm, after removal of oxide layer 16, patterning and wet etch 24 of oxide layer 17, which stops at the level of silicon in substrate 12, followed by deposition of an In$_2$O$_3$ layer 26 to a thickness of between about 10 nm to 100 nm and deposition of a titanium layer 28 to a thickness of between about 10 nm to 50 nm.

Figure 5:
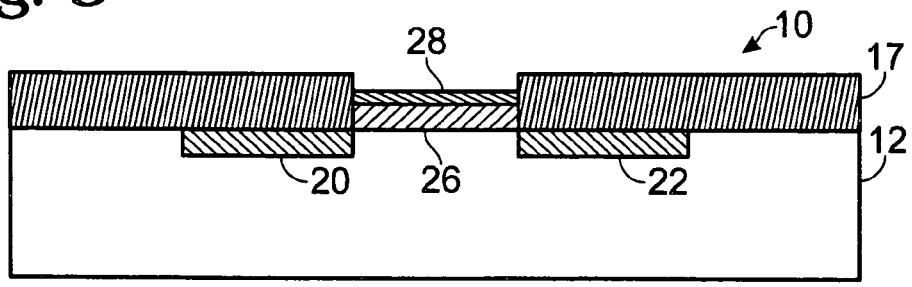

FIG. 5 shows the structure following patterning and etching of In$_2$O$_3$ layer 26 and titanium layer 28, deposition of additional oxide to layer 17, and patterning and etching of oxide layer 17, stopping at the level of titanium layer 28, step 30, which is, in reality, a two step process, described in greater detail later herein.

Figure 6:
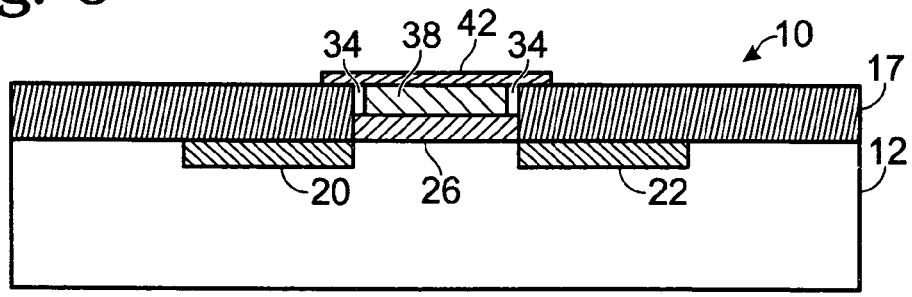

Referring to FIG. 6, the structure is patterned and wet etched 32 to remove titanium in the gate active region, which etching stops at the level of In$_2$O$_3$ layer 26. A layer of SiN 34 is deposited to a thickness of between about 20 nm to 50 nm and etched, leaving a SiN sidewall in the trench overlying the remaining In$_2$O$_3$ A layer of ferroelectric material 38, Pb$_5$Ge$_3$O$_{11}$ (PGO) in the preferred embodiment is deposited to a thickness of between about 200 nm to 500 nm on In$_2$O$_3$ layer 26. Other ferroelectric materials, such as Pb(Zr, Ti)O$_3$ (PZT), SrBi$_2$Ta$_2$O$_3$ (SBT) or Bi$_4$Ti$_3$O$_{12}$, may be used. The ferroelectric material is smoothed by chemical mechanical polishing (CMP) 40. A top electrode 42 is deposited on ferroelectric material 38.

Figure 7:
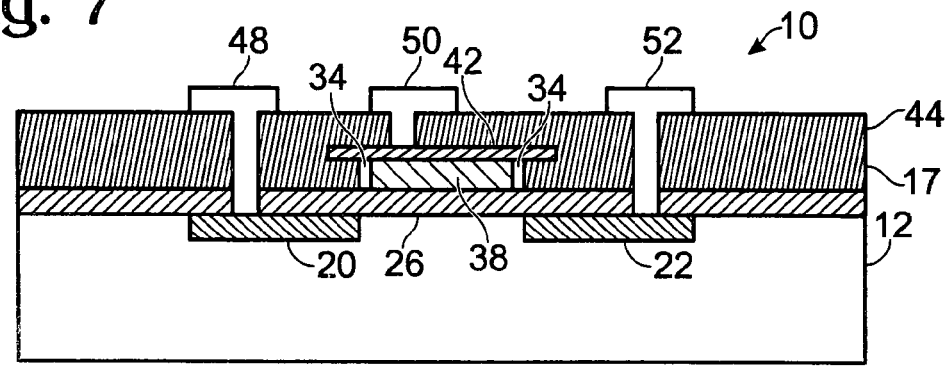

FIG. 7 depicts a nearly complete FeRAM device, which includes deposition of additional oxide 44, contact hole formation and metallization 46, resulting in metal contact 48, 50 and 52. Any further processes required to complete the FeRAM structure are then accomplished 54.

The selective etching processes of the method of the invention for SiO$_2$ titanium and In$_2$O$_3$ thin films provide for fabrication of a Metal/FE/In$_2$O$_3$/Si ferroelectric memory device. SiO$_2$ is patterned and etched, stopping at the upper surface of an In$_2$O$_3$ layer.

The following etching processes are used for patterning and etching SiO$_2$, and stopping at an In$_2$O$_3$ layer. Table 1 shows the chemistry and etching conditions of recipe A. The etching rates for In, In$_2$O$_3$ and SiO$_2$ thin films are 100 nm, 80 nm and 60 nm/minute respectively. Using recipe A to etch SiO$_2$ with the intent of stopping at the In$_2$O$_3$ thin films resulted in an over-etch of about 10 nm of In$_2$O$_3$.

TABLE 1

Recipe A

| Items | BCL (sccm) | Cl (sccm) | $T_{cp}$ RF (W) | Bias RF (W) | Pressure (mtorr) |
|---|---|---|---|---|---|
| Range | 10-50 | 40-80 | 200-500 | 100-200 | 4-8 |
| Preferred | 30 | 60 | 350 | 150 | 6 |

TABLE 2

Etching Rates for In, $In_2O_3$ and $SiO_2$ Thin Films

| Items | In | $In_2O_3$ | $SiO_2$ | Ti |
|---|---|---|---|---|
| Etching Rates (nm/minute) | ~100 | ~80 | ~60 | ~420 |

Figure 8:
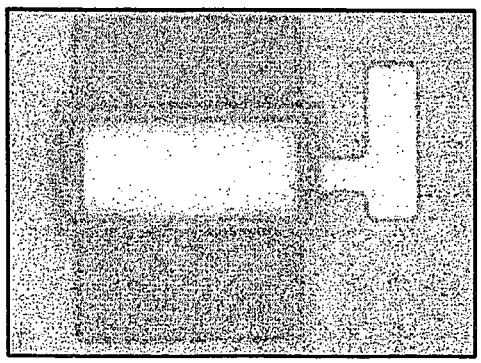
FIG. 8 is a microphotograph of a device constructed according to the method of the invention, wherein etching of SiO$_2$ is stopped at a titanium layer.

In order to improve the selective etching processes, two-step etching process is used, beginning with fabrication of a three layer structure of $SiO_2/Ti/In_2O_3$. In the first step, etching Recipe B, as shown in Table 3, is used to etch $SiO_2$ and titanium materials. The results show that the etch rate for $SiO_2$ is about 11 nm/seconds and that the etching rate for titanium is very low, as shown in Table 4. This indicates that Recipe B may be used to etch $SiO_2$ and stop at the titanium layer with minimal over-etch. The SEM in FIG. 8 depicts a photograph of etching of the $SiO_2$ layer, which etching stopped at the titanium layer.

TABLE 3

Recipe B

| Items | $C_3F_8$ (sccm) | Ar (sccm) | RF Source (W) | RF Bias (W) | Pressure (mtorr) |
|---|---|---|---|---|---|
| Range | 10-30 | 20-40 | 1000-3000 | 400-800 | 2-6 |
| Parameters | 18 | 30 | 1800 | 600 | 4 |

TABLE 4

Etching Rates for $SiO_2$ and Titanium Thin Films using Recipe B

| Items | $SiO_2$ | Ti |
|---|---|---|
| Etching Rates (nm/second) | ~11 | Very Low |

Figure 9:
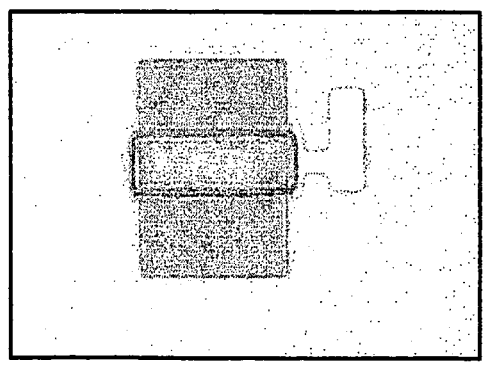
FIG. 9 is a microphotograph of a device constructed according to the method of the invention, wherein etching of titanium is stopped at a In$_2$O$_3$ layer.

In the second step, recipe A is used to etch titanium and $In_2O_3$. The etching rate for titanium and $In_2O_3$ materials are 420 nm/minute and 60 nm/minute, respectively, as shown in Table 2. Because there is a clear endpoint for titanium etching, stopping at the level of the $In_2O_3$ layer, recipe B may be used to etch titanium, stopping at the $In_2O_3$ layer, with only a few nanometers of over-etch. FIG. 9 is a SEM photograph of titanium etching which stopped at the level of the $In_2O_3$ layer. A wet etch processes may be used to etch titanium and stopping at the level of a $In_2O_3$ layer. A wet etching solution, which may be used instead of Recipe A, is $H_2O_2+5\% NH_4OH$, which can etch titanium and which does not appreciably etch $In_2O_3$.

Thus, a selective etching process for use in fabrication of a FeRAM device has been disclosed. It will be appreciated that further variations and modifications thereof may be made within the scope of the invention as defined in the appended claims.

We claim:

1. A method of selectively etching a three-layer structure consisting of $SiO_2$, $In_2O_3$, and titanium, comprising:
   etching the $SiO_2$, stopping at the titanium layer, using $C_3F_8$ in a range of between about 10 sccm to 30 sccm; argon in a range of between about 20 sccm to 40 sccm, using an RF source in a range of between about 1000 watts to 3000 watts and an RF bias in a range of between about 400 watts to 800 watts at a pressure in a range of between about 2 mtorr to 6 mtorr; and
   etching the titanium, stopping at the $In_2O_3$ layer, using BCl in a range of between about 10 sccm to 50 sccm; chlorine in a range of between about 40 sccm to 80 sccm, a $T_{cp}$ in a range of between about 200 watts to 500 watts at an RF bias in a range of between about 100 watts to 200 watts at a pressure in a range of between about 4 mtorr to 8 mtorr.

2. A method of fabricating a FeRAM using selective etching comprising:
   preparing a substrate;
   depositing an oxide layer on the substrate;
   patterning and etching the oxide layer provide a trench in a gate active region;
   depositing a layer of $In_2O_3$
   depositing a layer of titanium on the $In_2O_3$
   patterning and selectively etching the titanium, the $In_2O_3$ and the oxide, using a two step etching process consisting of:
      etching the $SiO_2$, stopping at the titanium layer, using $C_3F_8$ in a range of between about 10 sccm to 30 sccm; argon in a range of between about 20 sccm to 40 sccm, using an RF source in a range of between about 1000 watts to 3000 watts and an RF bias in a range of between about 400 watts to 800 watts at a pressure in a range of between about 2 mtorr to 6 mtorr; and
      etching the titanium, stopping at the $In_2O_3$ layer, using BCl in a range of between about 10 sccm to 50 sccm; chlorine in a range of between about 40 sccm to 80 sccm, a $T_{cp}$ in a range of between about 200 watts to 500 watts at an RF bias in a range of between about 100 watts to 200 watts at a pressure in a range of between about 4 mtorr to 8 mtorr;
   depositing a layer of SiN;
   etching the SiN layer to leave a sidewall only in the trench;
   depositing a ferroelectric material in the trench;
   depositing a top electrode and top oxide material; and
   completing the FeRAM device.

3. The method of claim 2 wherein said depositing a ferroelectric material includes depositing a layer ferroelectric material taken from the group of ferroelectric materials consisting of $Pb_5Ge_3O_{11}$ (PGO), $Pb(Zr, Ti)O_3$ (PZT), $SrBi_2Ta_2O_3$ (SBT) and $Bi_4Ti_3O_{12}$.

4. A method of fabricating a FeRAM using selective etching comprising:
   preparing a substrate;
   depositing an oxide layer on the substrate;
   patterning and etching the oxide layer provide a trench in a gate active region;
   depositing a layer of $In_2O_3$
   depositing a layer of titanium on the $In_2O_3$
   patterning and selectively etching the titanium, the $In_2O_3$ and the oxide, using a two step etching process consisting of:
      etching the $SiO_2$, stopping at the titanium layer, using $C_3F_8$ at 18 sccm; argon at 30 sccm, using an RF source at 1800 watts and an RF bias of 600 watts at a pressure of 3 mtorr; and etching the titanium, stopping at the $In_2O_3$ layer, using BCl at 30 sccm;

chlorine at 60 sccm, a $T_{cp}$ of 350 watts at an RF bias of 150 watts at a pressure of 6 mtorr;

depositing a layer of SiN;

etching the SiN layer to leave a sidewall only in the trench;

depositing a ferroelectric material in the trench;

depositing a top electrode and top oxide material; and completing the FeRAM device.

5. The method of claim 4 wherein said depositing a ferroelectric material includes depositing a layer ferroelectric material taken from the group of ferroelectric materials consisting of $Pb_5Ge_3O_{11}$(PGO), $Pb(Zr, Ti)O_3$(PZT), $SrBi_2Ta_2O_3$(SBT) and $Bi_4Ti_3O_{12}$.

* * * * *